(12) United States Patent
Ieong et al.

(10) Patent No.: US 7,547,641 B2
(45) Date of Patent: Jun. 16, 2009

(54) SUPER HYBRID SOI CMOS DEVICES

(75) Inventors: Meikei Ieong, Baoshan Township (TW); Qiqing C. Ouyang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 120 days.

(21) Appl. No.: 11/758,454

(22) Filed: Jun. 5, 2007

(65) Prior Publication Data

US 2008/0303090 A1 Dec. 11, 2008

(51) Int. Cl.
*H01L 21/8238* (2006.01)
(52) U.S. Cl. .................. 438/739; 438/218; 438/481; 438/738; 438/740
(58) Field of Classification Search ................. 257/204, 257/206, 265, 347, 351, 369, 371, 627; 438/218, 438/481, 738, 739, 740, 751
See application file for complete search history.

(56) References Cited

U.S. PATENT DOCUMENTS

| | | | | |
|---|---|---|---|---|
| 5,906,951 A | * | 5/1999 | Chu et al. .................. 438/751 |
| 6,974,981 B2 | * | 12/2005 | Chidambarrao et al. ..... 257/265 |
| 7,023,055 B2 | | 4/2006 | Ieong et al. |
| 7,098,508 B2 | | 8/2006 | Ieong et al. |
| 7,125,785 B2 | | 10/2006 | Cohen et al. |
| 7,145,166 B2 | | 12/2006 | Lee |
| 7,157,774 B2 | * | 1/2007 | Yeo et al. .................... 257/347 |
| 2004/0256700 A1 | * | 12/2004 | Doris et al. .................. 257/627 |
| 2005/0045995 A1 | * | 3/2005 | Ieong et al. .................. 257/627 |
| 2005/0093104 A1 | * | 5/2005 | Ieong et al. .................. 257/627 |
| 2005/0116290 A1 | * | 6/2005 | de Souza et al. ............ 257/347 |
| 2006/0145264 A1 | * | 7/2006 | Chidambarrao et al. ..... 257/369 |

* cited by examiner

*Primary Examiner*—Thao X Le
*Assistant Examiner*—Marvin Payen
(74) *Attorney, Agent, or Firm*—Scully, Scott, Murphy & Presser, P.C.; Vazken Alexanian (57) ABSTRACT

The present invention provides semiconductor structures comprised of stressed channels on hybrid oriented. In particular, the semiconductor structures include a first active area having a first stressed semiconductor surface layer of a first crystallographic orientation located on a surface of a buried insulating material and a second active area having a second stressed semiconductor surface layer of a second crystallographic orientation located on a surface of a dielectric material. A trench isolation region is located between the first and second active area, and the trench isolation region is partially filled with a trench dielectric material and the dielectric material that is present underneath said second stressed semiconductor surface layer. The dielectric material within the trench isolation region has lower stress compared to that is used in conventional STI process and it is laterally abuts at least the second stressed semiconductor surface layer and extends to an upper surface of the trench isolation region.

4 Claims, 11 Drawing Sheets

SUPER HYBRID SOI CMOS DEVICES

FIELD OF THE INVENTION

The present invention relates to high-performance semiconductor devices for digital or analog applications, and more particularly to complementary metal oxide semiconductor (CMOS) devices that have mobility enhancement from stress and surface orientation. Specifically, the present invention provides stressed CMOS devices that are located on a hybrid orientated substrate.

BACKGROUND OF THE INVENTION

In present semiconductor technology, CMOS devices, such as nFETs or pFETs, are typically fabricated upon semiconductor wafers, such as Si, that have a singe crystal orientation. In particular, most of today's semiconductor devices are built upon Si having a (100) crystal orientation.

Electrons are known to have a high mobility for a (100) Si surface orientation, but holes are known to have a high mobility for a (110) surface orientation. That is, hole mobility values on (100) Si are roughly 2x-4xlower than the corresponding electron mobility for this crystallographic orientation. To compensate for this discrepancy, pFETs are typically designed with larger widths in order to balance pull-up currents against the nFET pull-down currents and achieve uniform circuit switching. pFETs having larger widths are undesirable since they take up a significant amount of chip area.

Hole mobility on (110) Si is 2xhigher than on (100) Si; therefore, pFETs formed on a (110) surface will exhibit significantly higher drive currents than pFETs formed on a (100) surface. Unfortunately, electron mobility on (110) Si surfaces is significantly degraded compared to (100) Si surfaces.

As can be deduced from the above, the (110) Si surface is optimal for pFET devices because of excellent hole mobility, yet such a crystal orientation is completely inappropriate for nFET devices. Instead, the (100) Si surface is optimal for nFET devices since that crystal orientation favors electron mobility.

Hybrid oriented substrates having planar surfaces with different crystallographic orientation have recently been developed. See, for example, U.S. Patent Application Publication No. 2004/0256700 A1 and U.S. Pat. No. 7,023,055. Additionally, hybrid-orientated metal oxide semiconductor field effect transistors (MOSFETs) have recently demonstrated significantly higher circuit performance at the 90 nm technology node. As discussed above, the electron mobility and hole mobility can be optimized independently by placing the nFET on a (100) surface and the pFET on a (110) surface.

Although hybrid oriented substrates having planar surfaces of different crystal orientation can increase the carrier mobility, further improvement is needed in order to keep the performance scaling as devices are being scaled.

Another means to enhance carrier mobility is to introduce a stress into the channel of a MOSFET. Stress can be introduced into a single crystal oriented substrate by several methods including, for example, forming a stress inducing layer on top of the substrate and around the gate region. Although stress inducing layers can be used as a means to enhance carrier mobility, further improvement is still needed.

MOSFET structures have been proposed to have stressed channels on a hybrid oriented substrate. See, for example, U.S. Patent Application Publication No. 2006/0145264 A1. However, current substrate preparation for hybrid orientation (HOT) has a mixed substrate, SOI for nFETs and bulk for pFETs or vise versa. This would require the modification of circuit design due to different types of substrates for nFETs and pFETs.

U.S. Patent Application Publication No. 2005/0116290 A1 discloses a method utilizing localized amorphization and recrystallization of stacked template layers for fabricating a planar substrate having semiconductor layers of different crystallographic orientations. In particular, the '290 publication provides a means for fabricating a planar hybrid-orientation semiconductor-on-insulator (SOI) substrate structure comprising: at least two clearly defined single crystal semiconductor regions with different surface orientations, said at least two clearly defined single crystal semiconductor regions disposed on a common buried insulating layer, said common buried insulating layer disposed on a substrate.

In view of the drawbacks mentioned above with prior art techniques for improving the carrier mobility, there is still a need for providing a technique that is able to enhance the carrier mobility beyond that which can be achieved utilizing either hybrid oriented substrates, or stress inducing layers, and on a single SOI or bulk substrate.

SUMMARY OF THE INVENTION

The present invention provides semiconductor structures comprised of stressed channels (including uni-axial and/or bi-axial strained channels) on hybrid oriented surfaces on a homogeneous SOI substrate instead of a mixed substrate with SOI and bulk, wherein the combined technologies provide a synergistic improvement in carrier mobility as well as a method of fabricating the inventive semiconductor structures.

In general terms, the semiconductor structure of the present invention comprises a hybrid oriented semiconductor substrate having at least two planar surfaces of different crystallographic orientation, and at least one CMOS device located on each of the planar surfaces of different crystallographic orientation, wherein each CMOS device has a stressed channel. The hybrid oriented substrate comprises a homogeneous SOI substrate instead of a mixed substrate with SOI and bulk.

The semiconductor structures of the present invention include at least one trench isolation region that separates CMOS devices having different polarities from each other. That is, a trench isolation region including a trench dielectric material is typically present between an nFET and a pFET. The trench isolation region employed in the present invention has a region laterally abutting the active area of one of the semiconductor devices in which at least a portion thereof has been removed and filled with a dielectric material that has a lower stress value as compared to that of a conventional trench dielectric material and as such the entire stress value of the trench isolation region is lowered. In the present invention, the dielectric material present in the region that laterally abuts the active area of one of the semiconductor devices is different from that of the trench dielectric material.

In one embodiment, the region laterally abutting the active area of one of the semiconductor devices is completely removed and filled with the dielectric material having the lower stress value, In this embodiment, the region including the dielectric material having the lower stress value abuts the active areas of two different semiconductor devices, i.e., nFET and pFET, and it is located completely atop (i.e., horizontally abuts) the trench dielectric material.

Examples of lower stress dielectric materials that can be used in the present invention include, but are not limited to an air gap, a low-temperature oxide, a spun-on glass, a low k (k of less than 4.0) dielectric material that can be porous or non-porous and any combination thereof It is noted that the dielectric material having the lower stress value than the original trench dielectric material is also present underneath one of semiconductor surface layers of different crystallographic orientation and it serves as a buried insulating layer in that region, In general terms, the semiconductor structure of the present invention comprises:

a first active area having a first stressed semiconductor surface layer of a first crystallographic orientation located on a surface of a buried insulating material;

a second active area having a second stressed semiconductor surface layer of a second crystallographic orientation located on a surface of a dielectric material, wherein said first and second crystallographic orientations are different; and a trench isolation region located between said first and second active areas, said trench isolation region is partially filled with a trench dielectric material and said dielectric material that is present underneath said second stressed semiconductor surface layer, said dielectric material within said trench isolation region laterally abuts at least said second stressed semiconductor surface layer and extends to an upper surface of said trench isolation region that is coplanar with at least said second stressed semiconductor surface layer.

In one embodiment of the present invention, the first active area comprises a tensile stressed semiconductor surface layer in which at least one nFET is located thereon. In this embodiment, the second active area comprises a compressively stressed semiconductor surface layer in which at least one pFET is typically formed.

In addition to providing the semiconductor structures described above in which a hybrid oriented SOI substrate, stressed channels and a STI with lower stress compared to conventional STI are present, the present invention also provides a method of fabricating such structures. The method of the present invention includes providing a hybrid oriented substrate having at least two planar surfaces of different crystallographic orientation and forming at least one CMOS device on each of the planar surfaces of different crystallographic orientation, wherein each CMOS device includes a stressed channel. The hybrid oriented substrate is a homogeneous SOI substrate instead of a mixed substrate having both an SOI region and a bulk region.

In general terms, the method of the present invention comprises:

providing a hybrid orientated semiconductor substrate comprising a first active area having a first semiconductor surface layer of a first crystallographic orientation located on a surface of a buried insulating material and a second active area having a second semiconductor surface layer of a second crystallographic orientation located on a surface of a semiconductor substrate, wherein said first and second crystallographic orientations are different;

forming a trench isolation region located between said first and second active areas, said trench isolation region is filled with a trench dielectric material;

forming a lithographically defined opening within said trench isolation region in a region that laterally abuts said second semiconductor surface layer to expose sidewalls of said second semiconductor surface layer;

laterally etching at least an upper portion of a buffer layer that is present directly beneath said second semiconductor surface layer forming a cavity which extends below said second semiconductor surface layer; and filling said cavity and the lithographically defined opening within said trench isolation region with a dielectric material that has a lower stress value than said trench dielectric material.

In some embodiments of the present invention, the lithographically defined opening extends the entire width of the trench isolation region. In such an embodiment, the dielectric material located within the trench isolation region laterally abuts both the first semiconductor surface layer and the second semiconductor surface layer.

The method of present invention contemplates a step of forming at least one first FET within the first active area and forming at least one second FET within the second active area. In such an instance, the at least one first FET has a different conductivity than the at least one second FET.

DETAILED DESCRIPTION OF THE INVENTION

The present invention, which provides semiconductor structures including stressed channels on a hybrid oriented substrate as well as a method of fabricating the same, will now be described in greater detail by referring to the drawings that accompany the present application. It is noted that the drawings of the present application are provided for illustrative purposes and thus they are not drawn to scale. Moreover, in the drawings, like reference numerals are used in describing like and/or corresponding elements.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides semiconductor structures comprised of stressed channels (including uni-axial and/or bi-axial strained channels) on hybrid oriented surfaces on a homogeneous SOI substrate instead of a mixed substrate with SOI and bulk, wherein the combined technologies provide a synergistic improvement in carrier mobility as well as various methods of fabricating the inventive semiconductor structures.

In general terms, the semiconductor structure of the present invention comprises a hybrid oriented semiconductor substrate having at least two planar surfaces of different crystallographic orientation, and at least one CMOS device located on each of the planar surfaces of different crystallographic orientation, wherein each CMOS device has a stressed channel. The hybrid oriented substrate comprises a homogeneous SOI substrate instead of a mixed substrate with SOI and bulk.

The semiconductor structures of the present invention include at least one trench isolation region that separates CMOS devices having different conductivities from each other. The trench isolation region employed in the present invention has a region laterally abutting the active area of one of the semiconductor devices in which at least a portion thereof has been removed and filled with a dielectric material that has a lower stress value as compared to that of a conventional trench dielectric material and as such the entire stress value of the trench isolation region is lowered. In the present invention, the dielectric material present in the region that laterally abuts the active area of one of the semiconductor devices is different from that of the trench dielectric material.

It is noted that the dielectric material of lower stress value than the trench dielectric material laterally extends underneath the second semiconductor surface layer of the inventive structure and thus it serves as the buried insulating layer in that region of the structure.

Figure 1:
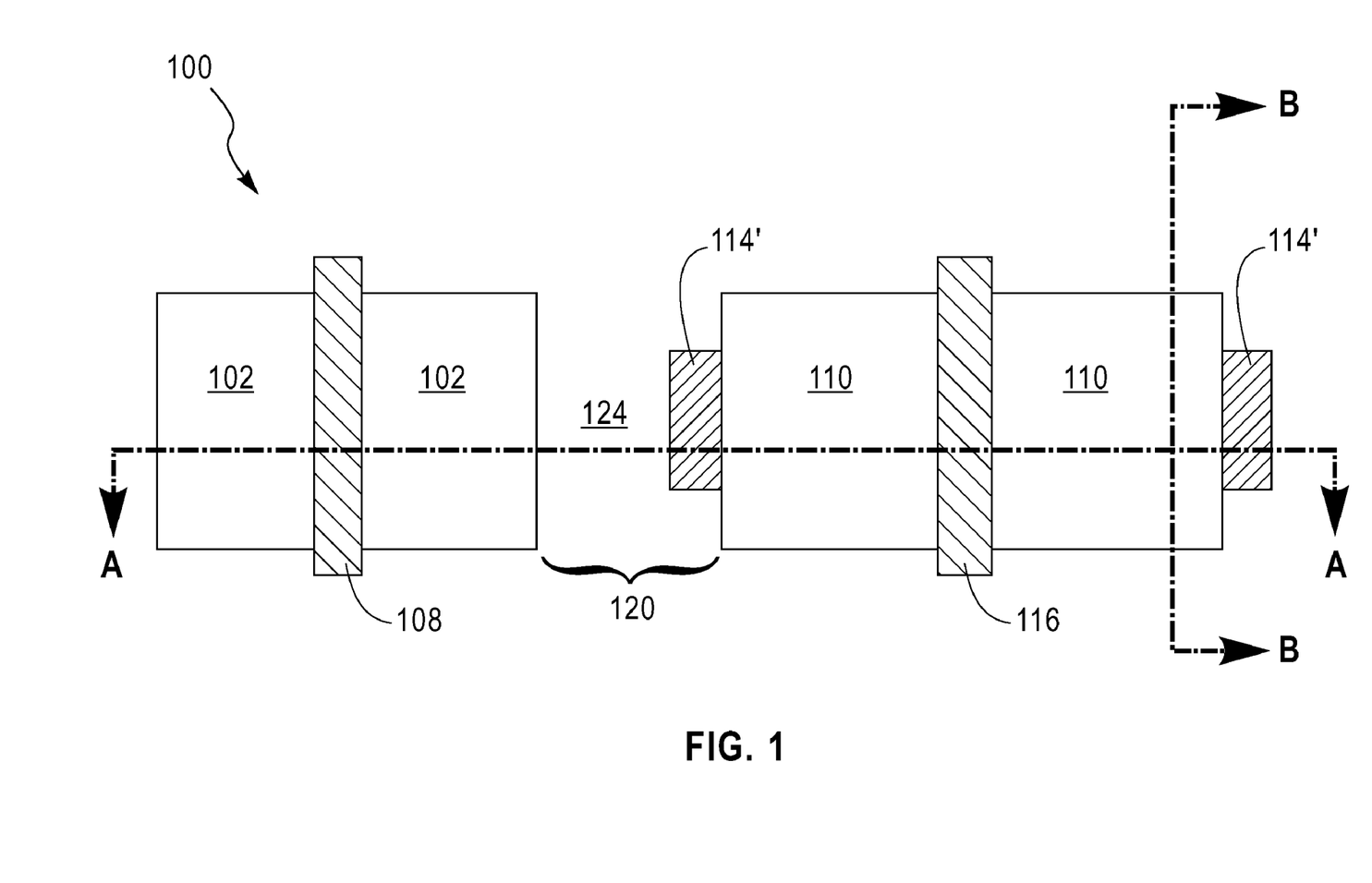
FIG. 1 is a pictorial representation (through a top-down view) illustrating one possible semiconductor structure in accordance with the present invention having stressed channels for an nFET and a pFET, said nFET and pFET are located on a hybrid oriented substrate having two planar surfaces of different crystallographic orientation.
Figure 2:
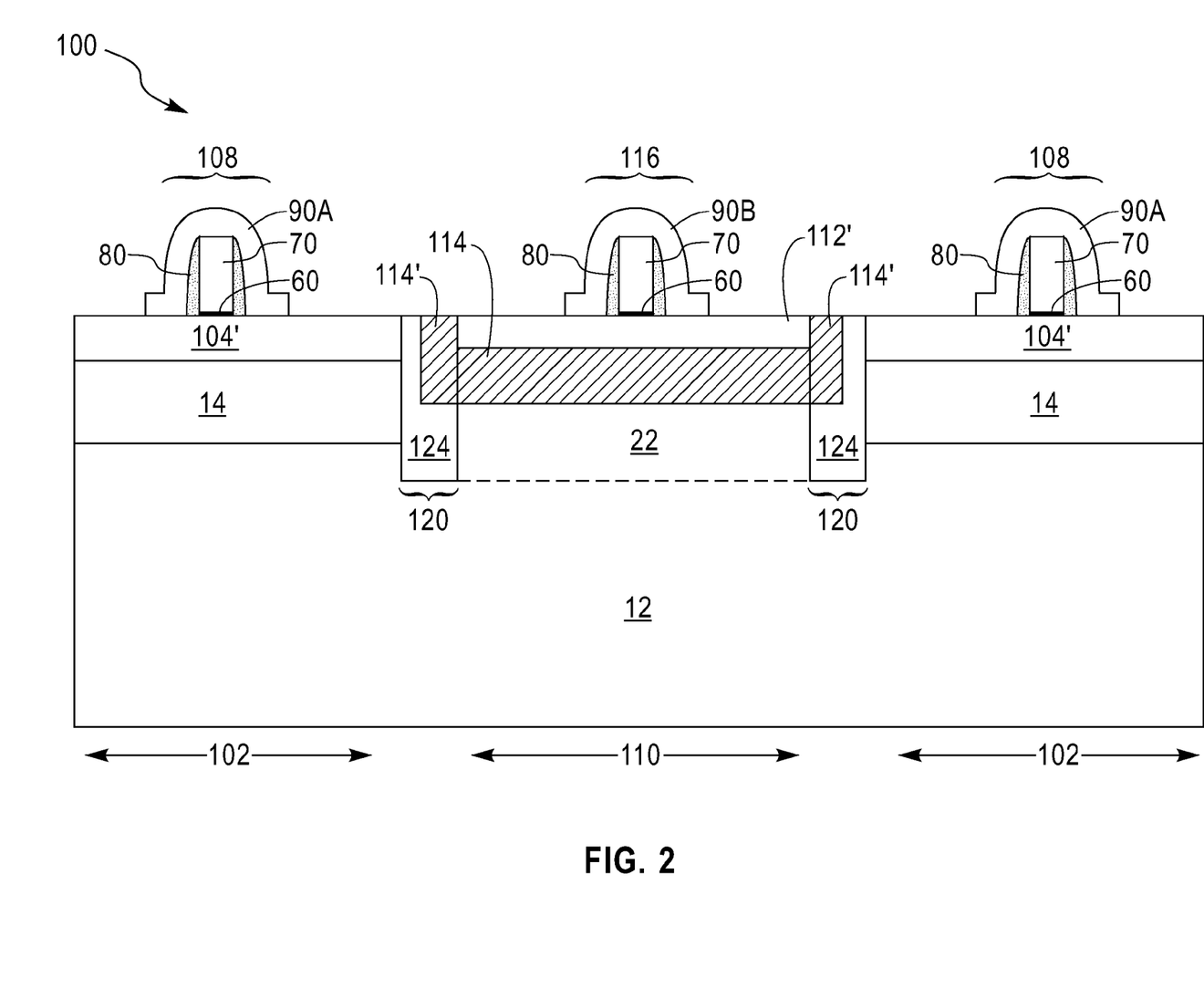
FIG. 2 is a pictorial representation (through a cross sectional view along A-A' in FIG. 1) illustrating one possible semiconductor structure in accordance with the present invention having bi-axial stressed channels on a hybrid oriented substrate having two planar surfaces of different crystallographic orientation.
Figure 3:
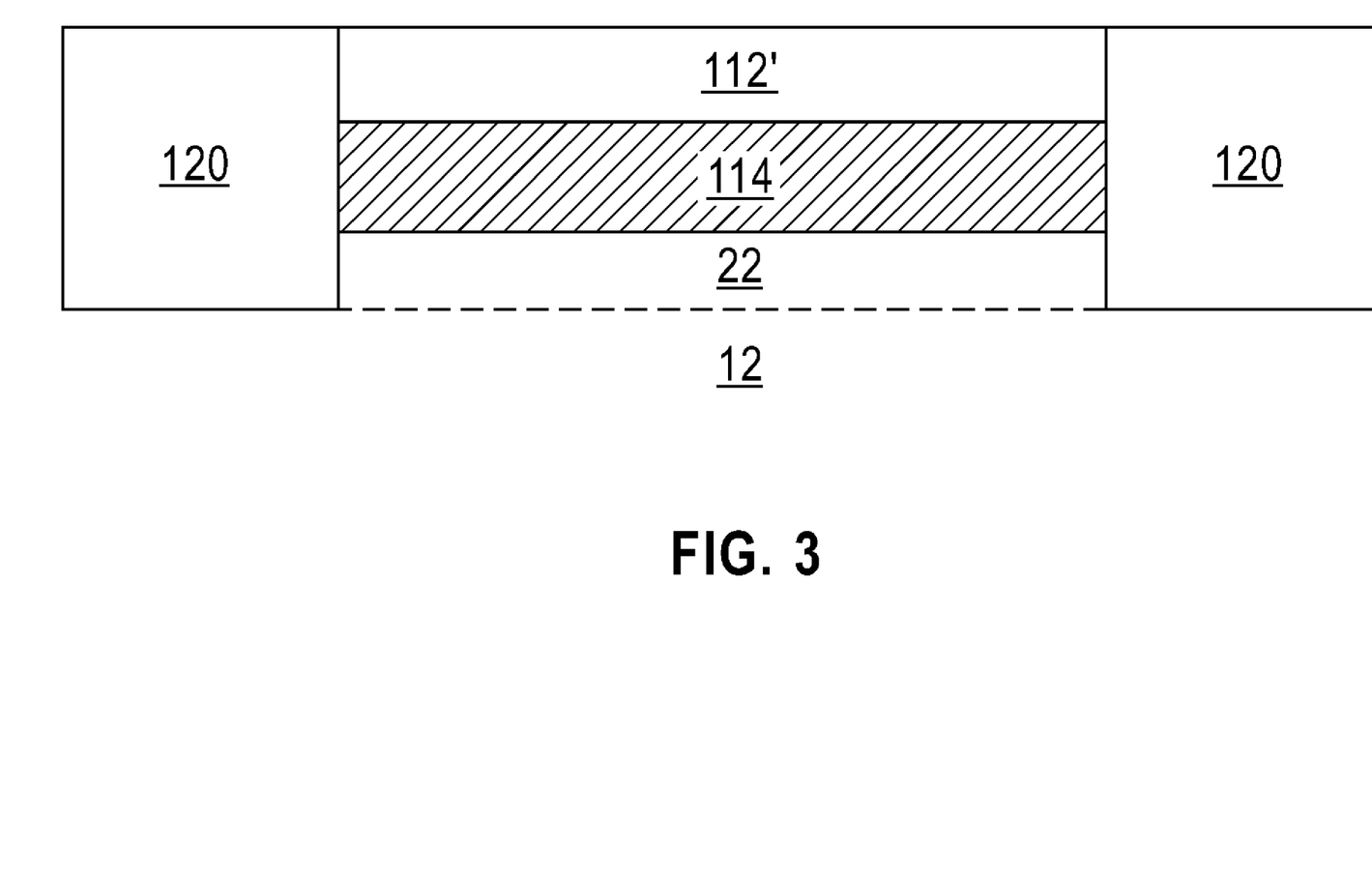
FIG. 3 is a pictorial representation (through a cross sectional view along B-B' in FIG. 1) illustrating the pFET area in accordance with the present invention having bi-axial stressed (110) $Si_{1-y}Ge_y$ channels on a hybrid oriented substrate with spin-on-glass serving as BOX.

Reference is now made to FIG. 1-3 which illustrate a typical semiconductor structure 100 of the present invention. FIG. 1 is a top-down illustration of the inventive semiconductor structure 100, FIG. 2 is a cross sectional view of the inventive semiconductor structure 100 through line A-A' shown in FIG. 1, and FIG. 3 is a cross sectional view of a second active area of the inventive structure through line B-B' shown in FIG. 1.

Specifically, the inventive structure 100 includes a first active area 102 having a first stressed semiconductor surface layer 104' of a first crystallographic orientation located on a surface of a buried insulating material 14. At least one first semiconductor device 108, i.e., FET, is located within the first active area 102. The components of the FET labeled in FIGS. 1-3 will be described in greater detail herein below.

At least one stress liner 90A is also present in the first active area 102 and the presence of the same introduces stress into the channel of the at least one semiconductor device 108.

A second active area 110 having a second stressed semiconductor surface layer 112' of a second crystallographic orientation is also shown in FIGS. 1-3. It is noted that in the inventive structure 100 the first and second crystallographic orientations are different. The second stressed semiconductor surface layer 112' is located on a surface of a dielectric material 114. The dielectric material 114 that is located beneath the second stressed semiconductor surface layer 112' functions as the buried insulating layer in the second active area 110 of the inventive structure 100. A semiconductor substrate 12 is shown below the buried insulating material 14 and the dielectric material 114.

At least one second semiconductor device 116, i.e., FET, is located within the second active area 110. The components of the FET labeled in FIGS. 1-3 will be described in greater detail herein below. At least one stress liner 90B is also present in the second active area 110 and the presence of the same introduces stress into the channel of the at least one semiconductor device 116.

FIGS. 1-3 also show the presence of at least one trench isolation region 120 located between the first active area 102 and the second active area 110. In the embodiment illustrated, the at least one trench isolation region 120 is partially filled with a trench dielectric material 124 and a dielectric material that is also present underneath the second stressed semiconductor surface layer 112'. In accordance with the invention, the dielectric material 114' within the at least one trench isolation region 120 laterally abuts at least the second stressed semiconductor surface layer 112' within the second active area 110. Additionally, the dielectric material 114' present in the at least one trench isolation region 120 extends to an upper surface of the trench isolation region which is coplanar with at least the second stressed semiconductor surface layer 112'. The dielectric material 114 beneath the second stressed semiconductor layer 112' serves as a buried insulating layer in that region of the inventive structure.

As stated above (and as will be elaborated more on in greater detail herein below), the dielectric material (114 and 114') has a lower stress value than that of the trench dielectric material 124. As a result of the presence of the dielectric material 114' within the at least one trench isolation region 120, the stress within the trench isolation region 120 is lowered as compared to that of a conventional trench isolation region including only a trench dielectric material. The effect of lowering the stress of the trench isolation region 120 reduces the harmful stress that causes degraded carrier mobility.

Figure 4:
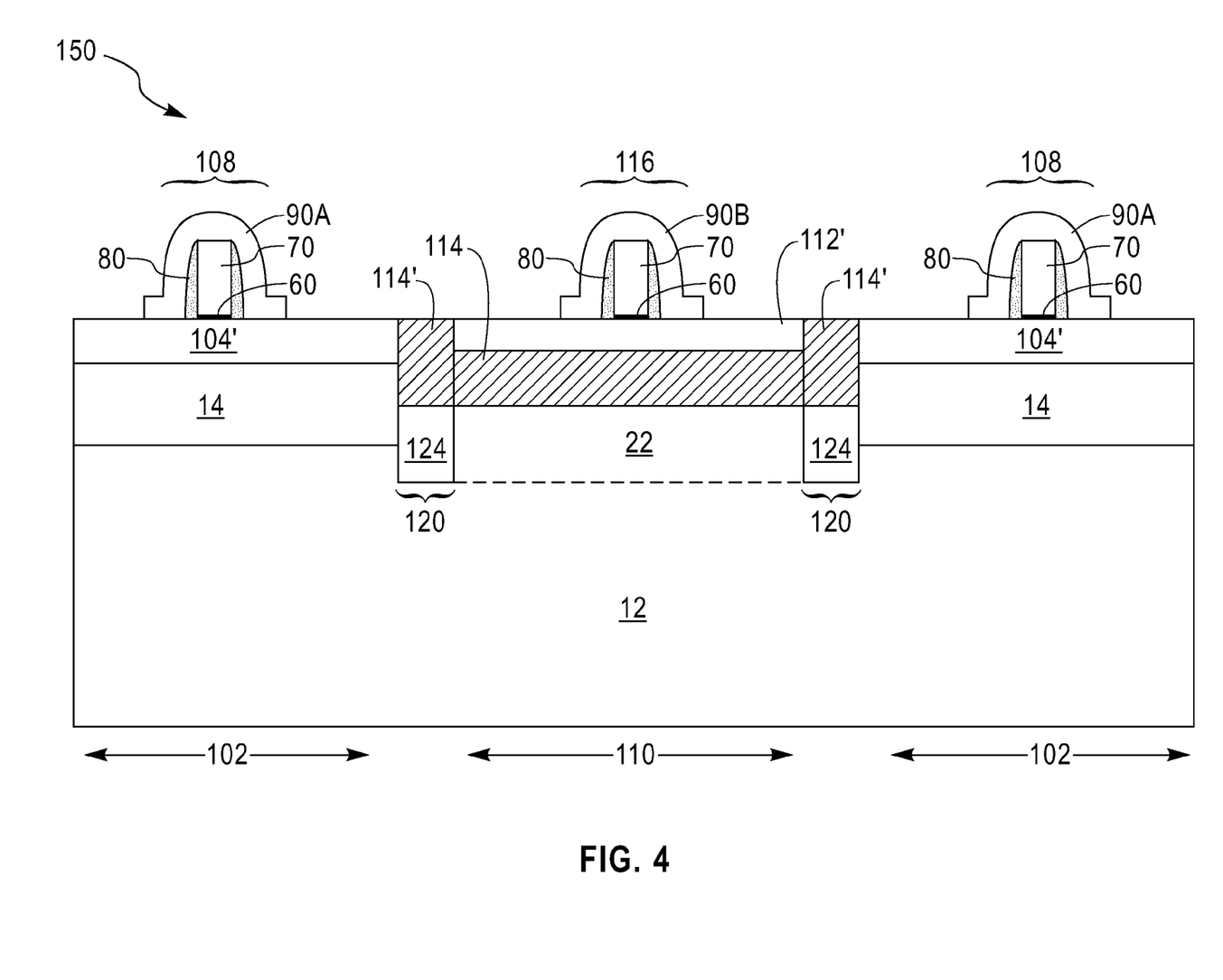
FIG. 4 is a pictorial representation (through a cross sectional view) illustrating another possible semiconductor structure in accordance with the present invention having bi-axial stressed channels on a hybrid oriented substrate having two planar surfaces of different crystallographic orientation.

FIG. 4 illustrates another semiconductor structure 150 of the present invention. Semiconductor structure 150 is similar to the semiconductor structure 100 depicted in FIGS. 1-3 and described above, except that dielectric material 114' present within the at least one trench 120 laterally abuts both the second stressed semiconductor surface layer 112' and the first stressed semiconductor surface layer 104'. In this embodiment, the dielectric material 114' within the trench isolation region 120 abuts the active areas of two different semiconductor devices, i.e., nFET and pFETs, and it is located completely atop (i.e., horizontally abuts) the trench dielectric material 124. In this embodiment, the presence of the dielectric material 114' within the trench isolation region 120 also lowers the stress within the trench isolation region 120. The effect of lowering the stress of the trench isolation region 120 in this embodiment reduces the harmful stress that causes degraded carrier mobility.

Reference is now made to FIGS. 5A-5G which are pictorial representations of the semiconductor structure 100 shown in FIGS. 1-3 through various processing steps of the present invention. It is noted that the processing steps described herein below can also be used in forming the semiconductor structure 150 shown in FIG. 4.

Figure 5A:
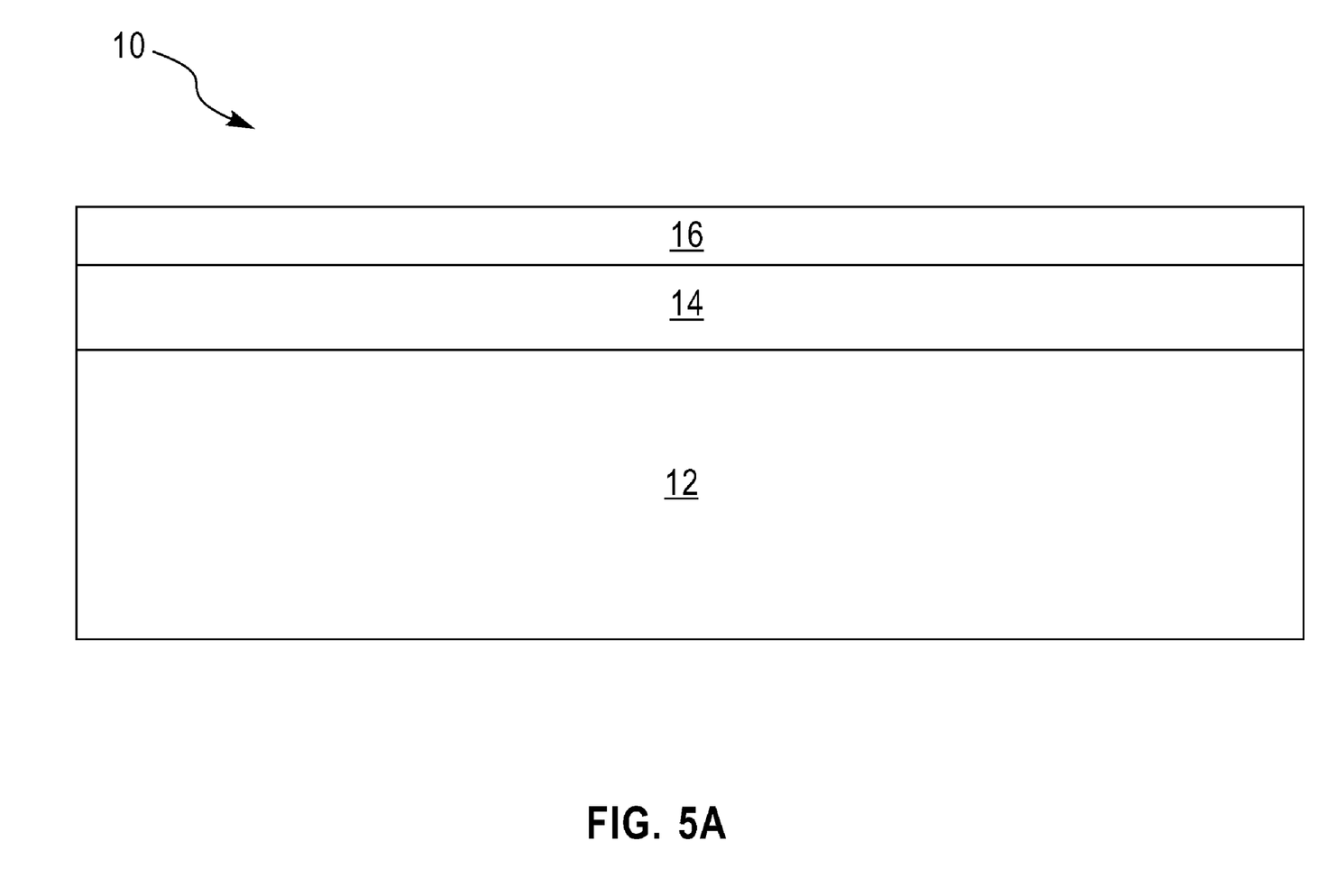
FIGS. 5A-5G are pictorial representations (through cross sectional views) illustrating the basic processing steps that are used in forming the inventive structure illustrated in FIG. 2.

The inventive process begins by providing an initial semiconductor substrate 10 such as shown in FIG. 5A. The initial semiconductor substrate 10 shown in FIG. 5A comprises a semiconductor substrate 12, a buried insulating layer 14 located on the semiconductor substrate 12 and a top semiconductor layer 16 located on the buried insulating layer 14. It is noted that a portion of the top semiconductor layer 16 that is not removed by subsequent processing steps will subsequently form a first semiconductor surface layer 104 of the inventive structure.

The semiconductor substrate 12 may comprise any semiconductor material including, for example, Si, SiGe, SiGeC, SiC, Ge alloys, GaAs, InAs, InP as well as other III/V or II/VI compound semiconductors. Typically, the semiconductor substrate 12 is a Si-containing substrate. The semiconductor substrate 12 has a different crystallographic surface orientation as compared to that of the top semiconductor layer 16. Illustratively, the semiconductor substrate 12 can have a (100) or (110) crystal orientation, with a (110) crystal orientation being preferred for the embodiment illustrated. Other Miller indices (major and minor) are also possible. Although other Miller indices are possible, the two mentioned herein are preferred since the (100) surface provides optimal device performance for pFETs, while the (110) surface provides optimal performance for nFETs. The semiconductor substrate 12 may be intrinsic or it may be doped with, for example, but not limited to B, As or P.

The buried insulating layer 14 is comprised of an insulating material including, for example, a crystalline or non-crystalline oxide, nitride, sapphire or any combination thereof. Typically, the buried insulating layer 14 is comprised of an oxide. Typically, the buried insulating layer 14 is formed during the initial stages of a layer transfer process used to create the substrate shown in FIG. 5A.

The top semiconductor layer 16 comprises any semiconductor material including one of the semiconductor materials mentioned for the semiconductor substrate 12. Typically, the top semiconductor layer 16 is a strained Si-containing layer, i.e., strained Si, or a relaxed SiGe alloy. As indicated above, the top semiconductor layer 16 has a different crystallographic surface orientation as compared to that of the semiconductor substrate 12. On one hand, and when the semiconductor substrate 12 has a (100) crystallographic orientation, the top semiconductor layer 16 has a (100) crystallographic orientation. On the other hand, and when the semiconductor substrate 12 has a (100) crystallographic orientation, the top semiconductor layer 16 has a (110) crystallographic orientation. For the embodiment illustrated, the top semiconductor layer 16 has a (100) crystallographic orientation.

The initial substrate 10 shown in FIG. 5A is made utilizing techniques well known to those skilled in the art. For example, a layer transfer process including wafer bonding can be used to form the initial structure 10 shown in FIG. 5A. A thermal mixing process including an ion implantation step can also be used to form the initial structure when the top semiconductor layer 16 is comprised of a relaxed SiGe alloy. Reference is made to U.S. Pat. Nos. 7,023,055, 7,098,508 and 7,125,785 and U.S. Patent Application Publication No. 2004/0256700 A1 for examples of various techniques that can be used in forming the initial structure 10 shown in FIG. 5A. The disclosures of each of the aforementioned patents and publications are incorporated herein by reference.

Next, a pad stack 18 comprising for example, a lower pad oxide and an upper pad nitride, is formed on the exposed surface of the top semiconductor layer 16. The pad stack 18 is formed utilizing conventional techniques well known to those skilled in the art including for example, thermal oxidation, thermal nitridation, chemical vapor deposition (CVD), plasma enhanced chemical vapor deposition (PECVD), atomic layer deposition (ALD), chemical solution deposition and any combination thereof.

A photoresist material is then formed atop the pad stack utilizing a conventional deposition process such as, for example, spin-on coating, CVD, PECVD, evaporation and chemical solution deposition. The photoresist material is then patterned by a lithographic step which includes exposing the applied photoresist material to a desired pattern of radiation and developing the exposed resist utilizing a conventional resist developer. The pattern in the photoresist material is then transferred to the underlying pad stack utilizing at least one etching process including, for example, a dry etching process (i.e., reactive ion etching, ion beam etching, plasma etching or laser ablation) and/or a wet chemical etching process. Typically, the patterned photoresist material is removed from the structure after the pattern has been transferred to the underlying pad stack.

Figure 5B:
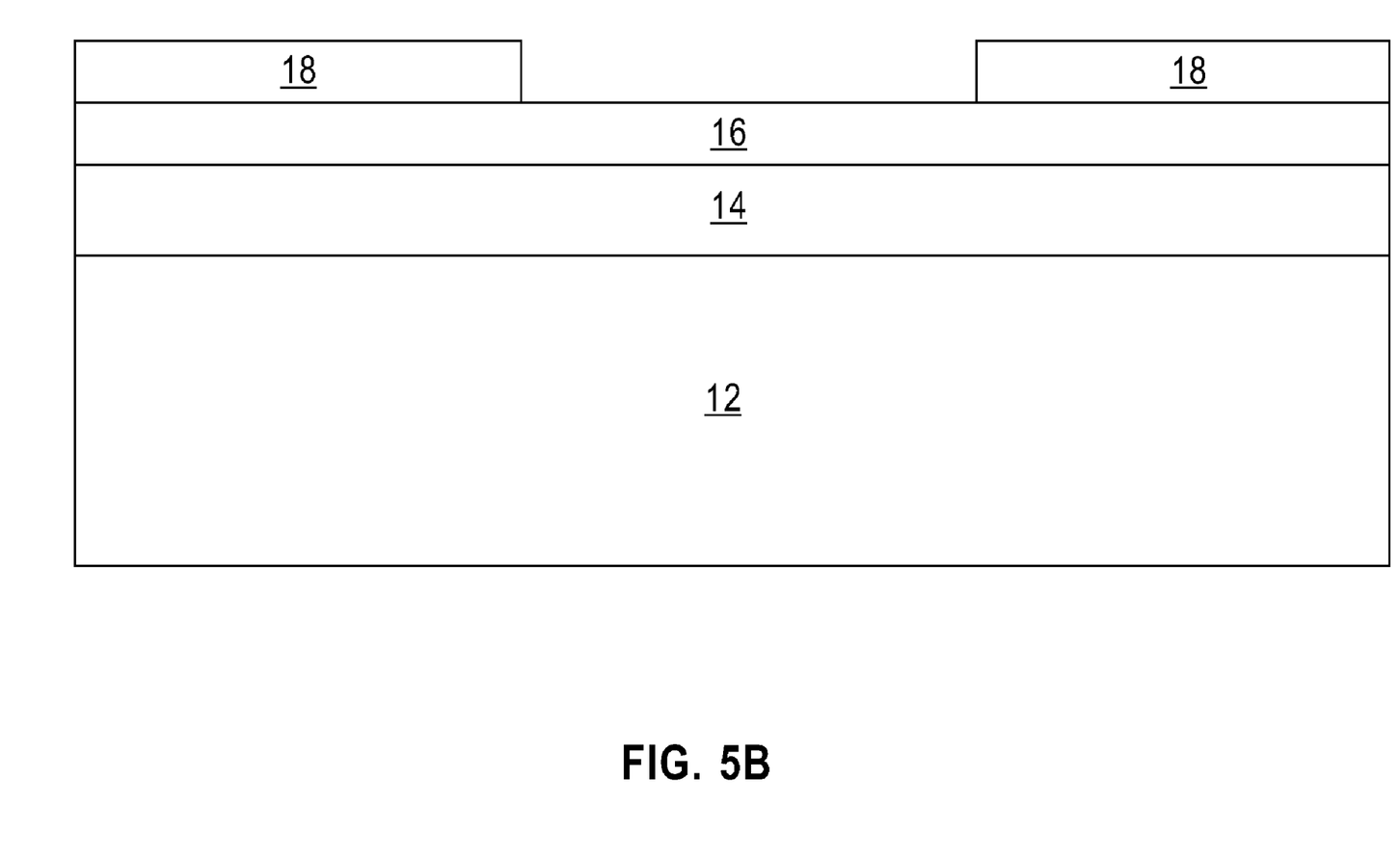

FIG. 5B illustrates the structure that is formed after the above processing steps have been performed. As shown, the structure includes initial semiconductor substrate 10 and patterned pad stack 18 located atop the top semiconductor layer 16. As shown, at least one portion of the top semiconductor layer 16 is protected by the patterned pad stack 18, while leaving at least one other portion of the top semiconductor layer 16 exposed. The protected portion is used in defining the first active area 102 of the inventive structure, while the at least one other non-protected portion is used in defining the second active area 110 of the inventive structure.

Figure 5C:
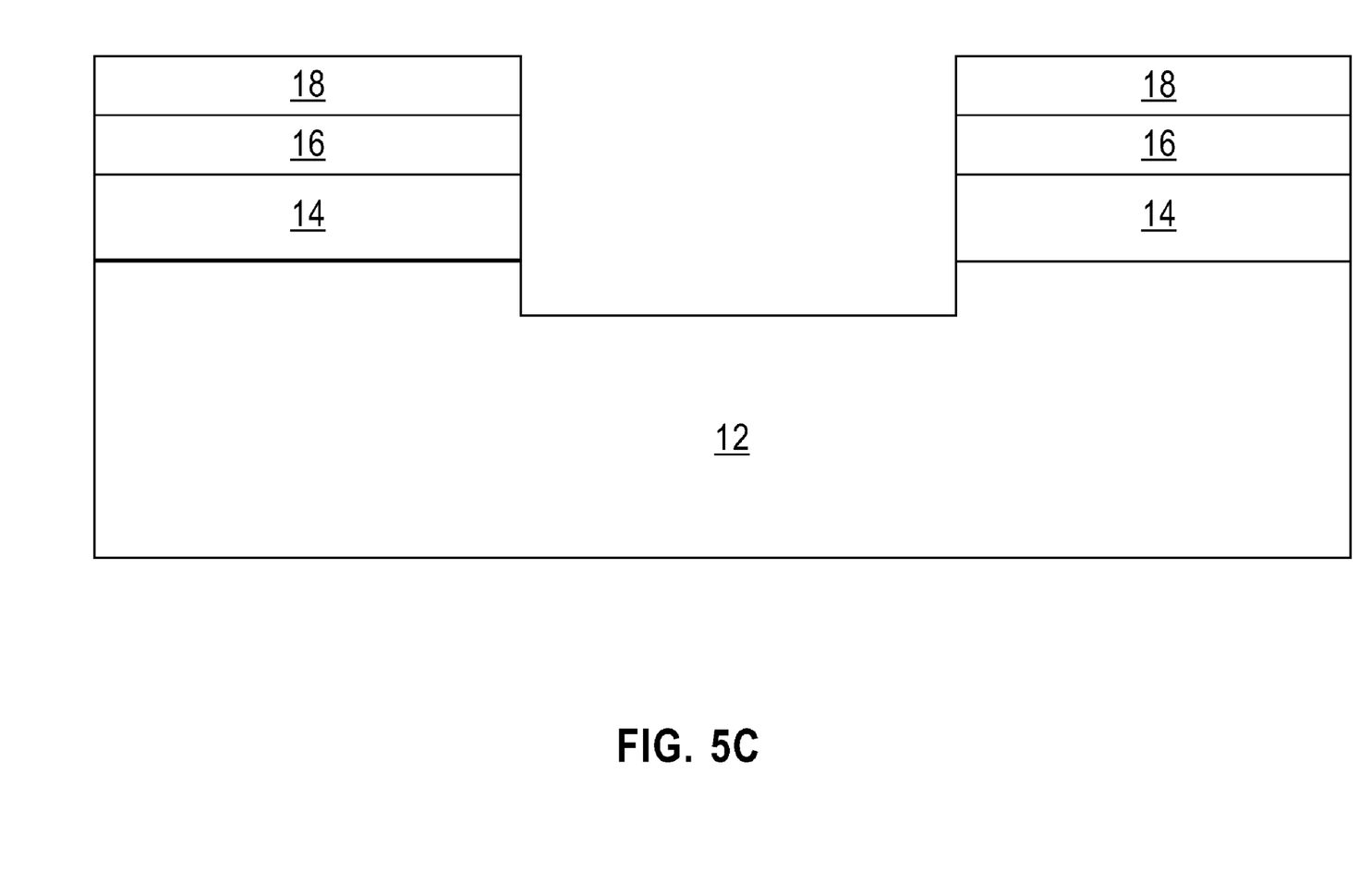

FIG. 5C shows the structure after etching through the at least one exposed portion of the top semiconductor layer 16 and through the buried insulating layer 14 stopping on a surface of the underlying semiconductor substrate 12. The etching used in forming the structure shown in FIG. 5C includes a dry etching and/or a wet chemical etching process. Typically, a reactive ion etching process is used to remove the portions of the top semiconductor layer 16 and the buried insulating layer 14 that are not protected by the patterned pad stack 18.

Figure 5D:
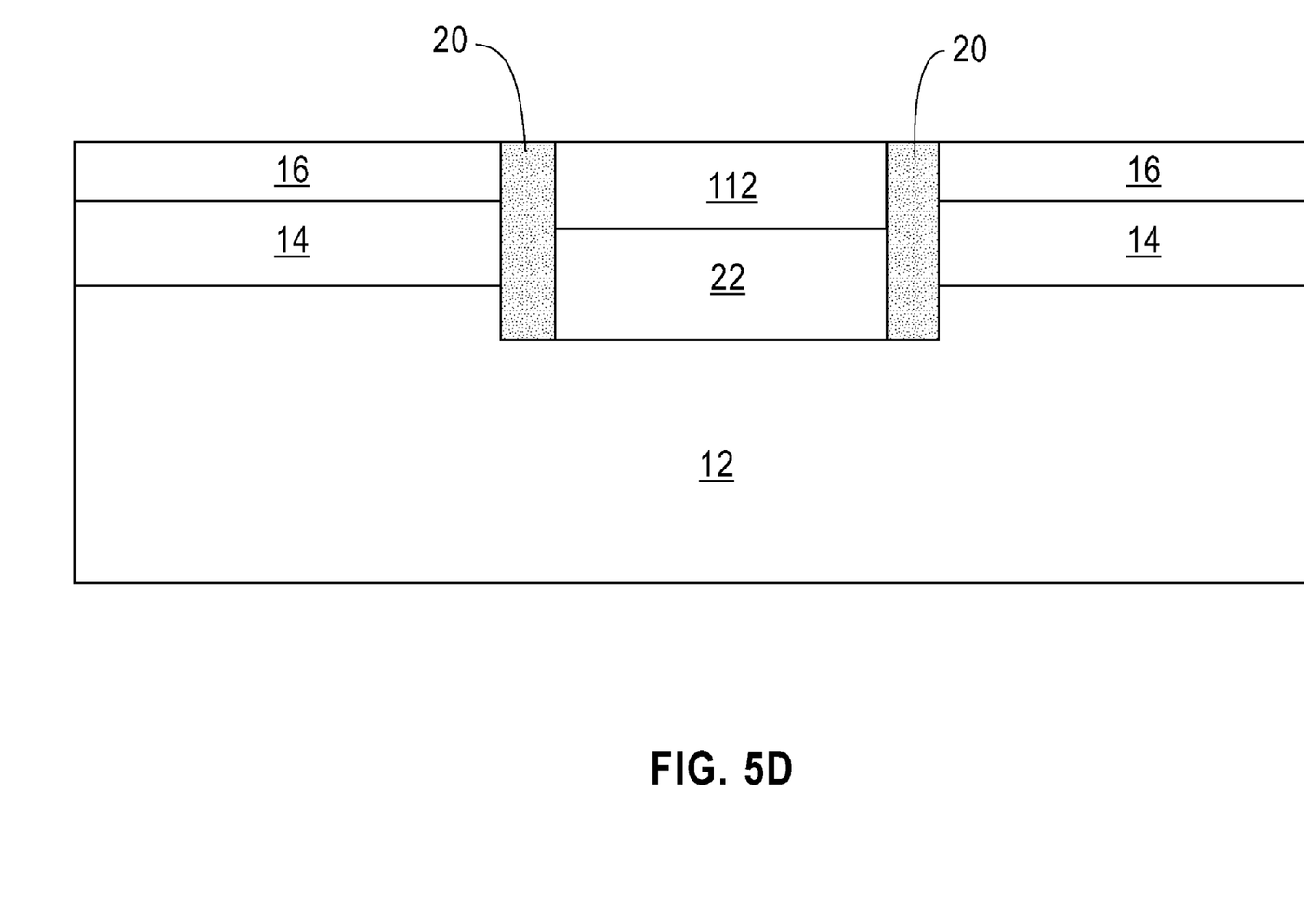

FIG. 5D shows the structure of FIG. 5C after performing a series of processing steps including first forming a dielectric spacer 20 on the exposed sidewalls of at least the remaining portions of the top semiconductor layer 16 and the buried insulating layer 14. The dielectric spacer 20 is comprised of an oxide or nitride and it is formed by deposition and a directional etching process.

After forming the dielectric spacer 20, a $Si_{1-x}Ge_x$ buffer layer 22 in which x is greater than or equal to zero can be formed by a conventional non-selective epitaxial growth process. The buffer layer 22 can be undoped or n+ doped by in situ doping during epitaxial growth or by ion implantation. Following the epitaxial growth of the $Si_{1-x}Ge_x$ buffer layer 22, buffer layer 22 is planarized by chemical mechanical polishing (CMP), which stops on layer 18, and thereafter the buffer layer 22 is recessed. In some embodiments, the buffer layer 22 is recessed to a level that is beneath that of the top semiconductor layer 16. Next, a second semiconductor surface layer 112 comprising a $Si_{1-y}Ge_y$ alloy where y is greater than x or a pure Ge layer is formed atop the SiGe buffer layer 22 by utilizing a conventional epitaxial growth process. Since epitaxy is used in forming the $Si_{1-x}Ge_x$ buffer layer 22 and the second semiconductor surface layer 112, layers 22 and 112 have the same crystallographic orientation as that of the semiconductor substrate 12.

Typically, the epitaxy of the second semiconductor surface layer 112 is performed so as to extend layer 112 onto exposed horizontal surfaces of the patterned pad stack 18.

A planarization process such as, for example, chemical mechanical polishing (CMP) and/or grinding) is then employed to remove the portion of the second semiconductor surface layer 112 that extends onto the horizontal surface of the patterned pad stack 18. After this planarization step, the remaining pad stack 18 is removed providing the structure shown in FIG. 5D. After removing the pad stack 18, a new pad stack 18' is formed; the presence of the new pad stack 18' prevents strain relaxation in the $Si_{1-y}Ge_y$ layer 112 after undercutting by a wet etching process or by a chemical downstream etching process and refilling with a dielectric material. The new pad stack 18' is shown in FIG. 5E.

Another way of making the structure in FIG. 5D is to use a selective epitaxial process. After the spacer 20 is formed, the $Si_{1-x}Ge_x$ buffer layer 22 is formed by a selective epi process. In such a process, the $Si_{1-x}Ge_x$ buffer layer 22 is grown only as thick as needed. No epi is grown on top of the pad stack 18 which is consists of an oxide and/or a nitride. Therefore, CMP and recessing used typically with a conventional non-selective epi can be omitted here. During the same selective epi process, it is possible to change the process conditions to continue to grow the second semiconductor surface layer 112 comprising a $Si_{1-y}Ge_y$ alloy. The growth of $Si_{1-y}Ge_y$ can either be flush (to the top surface of layer 16 or to the top surface of layer 18) or overfill (above the top surface of layer 18). In the case of flush to the top surface of layer 18, etch back is needed to bring the $Si_{1-y}Ge_y$ layer (i.e., layer 112) flush to the top surface of layer 16. On the other hand, in the case of overfill, CMP is needed to planarize the $Si_{1-y}Ge_y$ layer and etch back (via oxidation and etch of oxide or direct $Si_{1-y}Ge_y$ etch by timed etch) to make it flush to the top surface of layer 16.

Figure 5E:
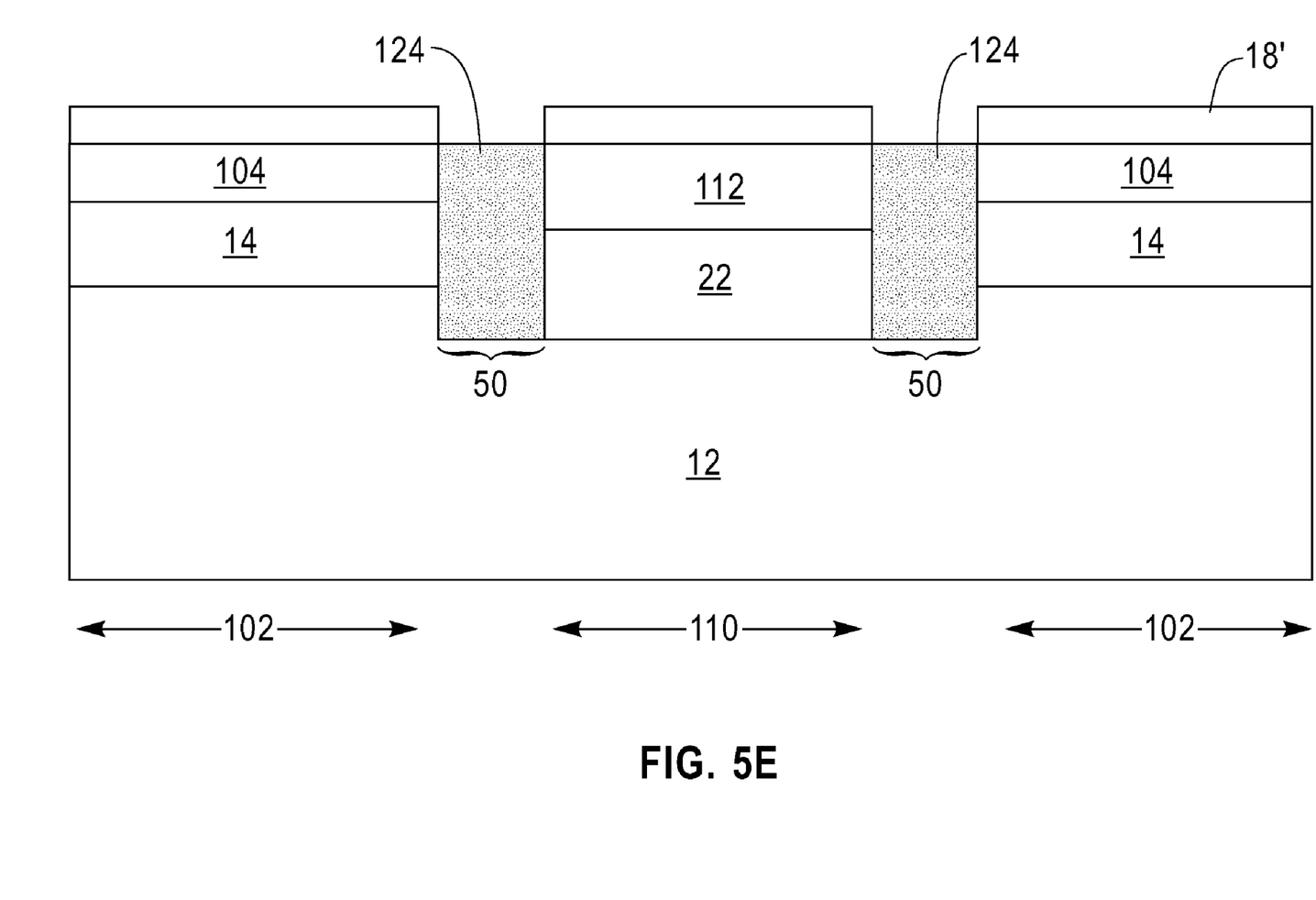

FIG. 5E shows the structure after forming at least one trench isolation region 50 (the at least one trench 50 is a conventional trench isolation region at this point of the inventive process) within the structure and forming a new pad stack 18' atop the entire structure after trench isolation region 50 formation. The at least one trench isolation region 50 is formed by a conventional trench isolation process which is well known to those skilled in the art. For example, the at least one trench isolation region 50 can be formed by reforming a patterned pad stack (not shown) on the structure shown in FIG. 5D. The patterned pad stack has an opening that is located in a predetermined region by lithography. The predetermined region typically includes the dielectric spacer 20. An etching process is then performed to remove all the exposed materials forming a trench within the structure that extends below the bottom most surface of the buried insulating layer 14. The trench is the filled with a conventional trench dielectric material 124. Typically, the trench dielectric material 124 is an oxide that is formed by high density plasma deposition (HDP). A densification step may optionally be preformed after filling the trench with the trench dielectric material 124. In some embodiments, a diffusion liner (mostly nitride) may be formed prior to filling the trench with the trench dielectric material 124. After filling the trench with the trench dielectric material 124, a CMP process is typically performed to remove excess trench dielectric material. The pad stack used in forming the trench isolation region is removed and thereafter a new pad stack 18' is formed by conventional techniques across the entire surface of the structure providing the structure shown in FIG. 5E.

The structure shown in FIG. 5E now includes first active area 102 having a first semiconductor surface layer 104 of a first crystallographic orientation (i.e., the remaining top semiconductor layer 16) located on a surface of a buried insulating material 14. The structure also includes a second active area 110 having the second semiconductor surface layer 112 of a second crystallographic orientation. The structure also includes the presence of at least one trench isolation region 50 located between the first active area 102 and the second active area 110. In the embodiment illustrated, the at least one trench isolation region 50 is completely filled with a trench dielectric material 124 at this point of the inventive process.

Figure 5F:
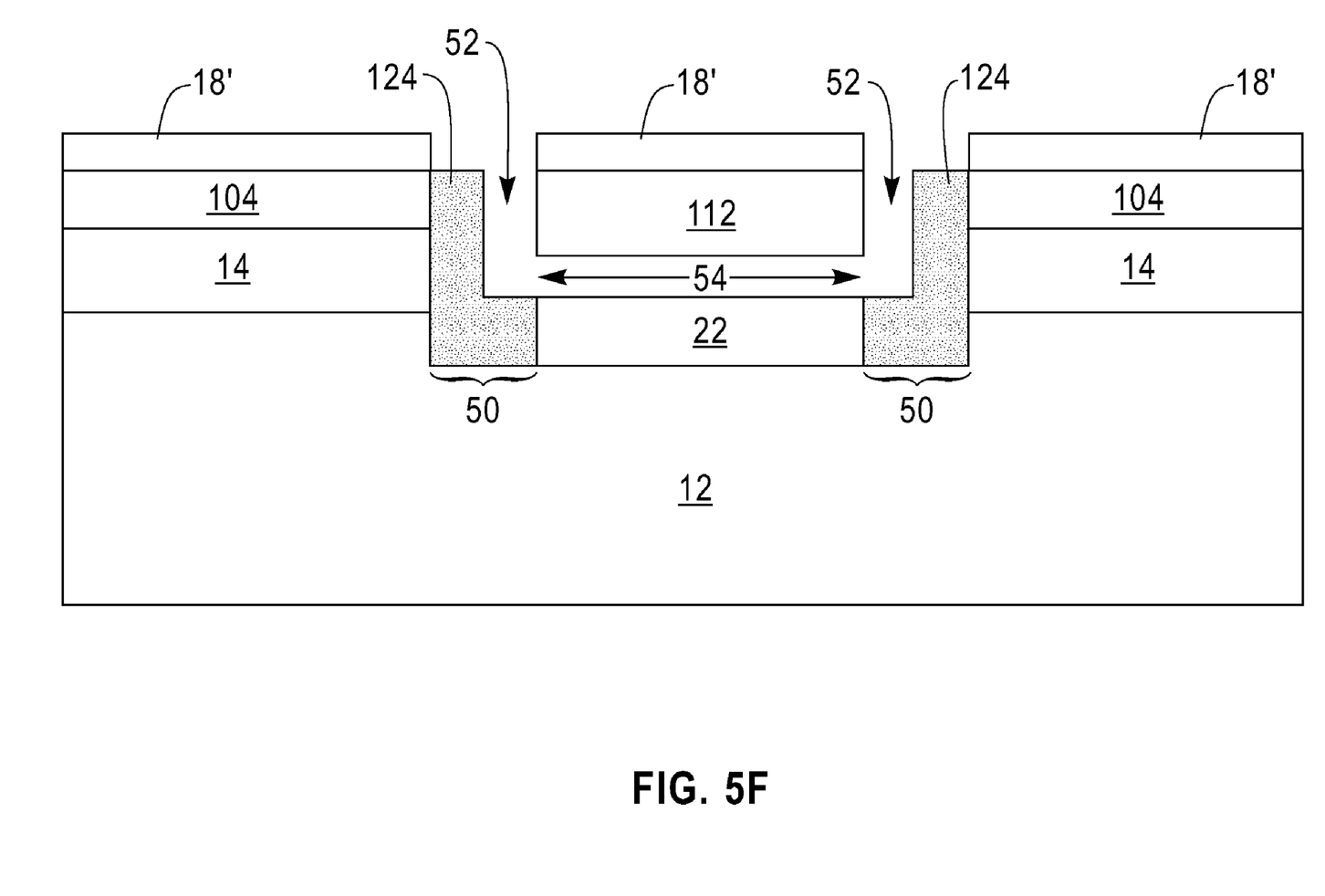

Reference is now made to FIG. 5F which illustrates the structure after removing an upper or entire portion of the $Si_{1-x}Ge_x$ buffer layer 22 from the structure (the second semiconductor surface layer 112 serves as a bridge over the cavity 54 that is thus formed). The structure shown in FIG. 5F is formed by first providing a patterned photoresist mask (not shown) having at least one opening that exposes a portion of the pad stack 18' that is located above a portion of the at least one trench isolation region 50 that is abutting the second semiconductor surface layer 112. With the patterned photoresist mask in place, the exposed portion of the pad stack 18' and underlying portions of the trench isolation region (i.e., the trench dielectric material 124) are removed by utilizing a dry etching process forming a lithographically defined opening 52 within the trench isolation region 50. A lateral etching process that selectively removes at least an upper portion of the $Si_{1-x}Ge_x$ buffer layer 22 as compared to the second semiconductor surface layer 112 and the remaining trench dielectric material 124 is then performed to form the cavity 54 beneath the second semiconductor surface layer 112. An example of such a lateral etching process includes a chemical wet etch process or chemical downstream etching.

The type of etching used is dependent on whether the buffer layer 22 is doped or undoped. For an undoped layer, a chemical wet etching process can be used to selectively etch out the buffer layer 22 when x is less than 10% and a portion of the substrate 12 and stop on the $Si_{1-y}Ge_y$ layer (when y is greater than 25%). The wet etching process is described in detail in U.S. Pat. No. 6,890,835. In one embodiment, the wet etching includes a solution of ethylenediamine, pyrocatechol, pyrazine, water (EPPW or EDP) and etching is performed at a temperature in the range from about 90° to about 120° C. In another embodiment, the wet etching includes a solution of 20% KOH and etching is performed at a temperature from about 75° to about 850° C. In yet another embodiment, the wet etching includes an organic Si etchant solution of TMAH (tetramethyl ammonium hydroxide). The etching selectivity of a Si (100) to $Si_{1-x}Ge_x$ (x=0.15–0.3) in EPPW is experimentally determined to be in the range of 50-1800. The etching selectivity of Si (100) to $Si_{1-x}Ge_x$ (x=0.2–0.3) in KOH is experimentally determined to be in the range of 350-1280, and the etching selectivity of Si (100) to $Si_{1-x}Ge_x$ (x=0.2–0.3) in TMAH is experimentally determined to be in the range of 50-115. EPPW, KOH or TMAH has a much higher etching rate of Si compared to $Si_{1-y}Ge_y$ (y>0.1), as a result, the etching process stops nicely at the strained $Si_{1-y}Ge_y$ layer without any additional etch stop layer such as a p++ SiGe etch stop layer as described in U.S. Pat. No. 5,906,951.

For an n+ doped layer, wet etching can be used or alternatively chemical downstream etching (CDE) can be used. CDE is one type of reactive ion etching process which is isotropic. CDE etches out the n+ doped $Si_{1-x}Ge_x$ layer. The gas used in CDE includes HBr, $Cl_2$ and He. The temperature range for CDE is from about 50° to about 100° C.

Following the etching process, the remaining pad stack 18' is removed utilizing a conventional etching process such as a wet chemical etching using BHF or DHF.

Figure 5G:
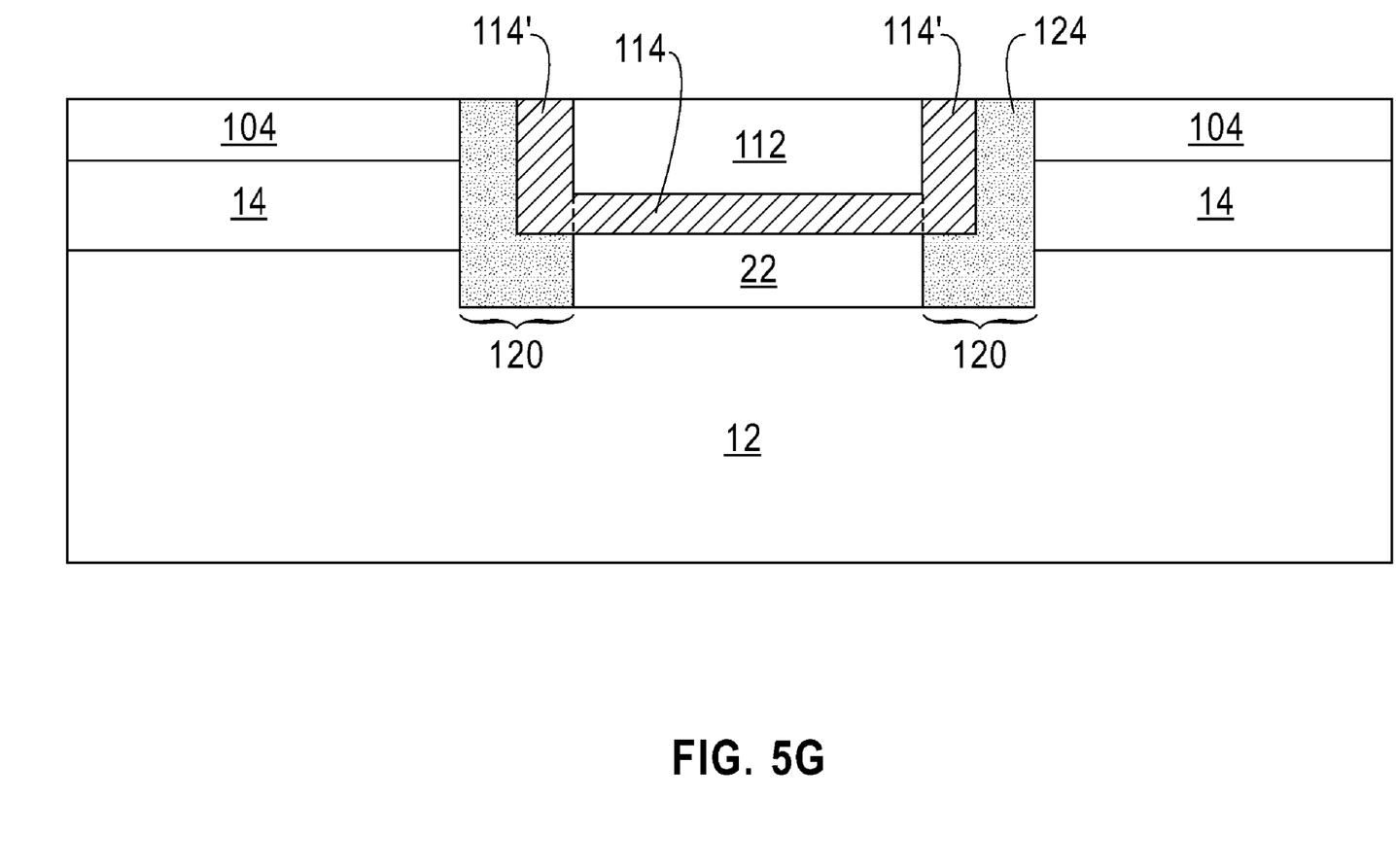

A dielectric material 114 and 114' having a lower stress value than that of the trench dielectric material 124 is the formed into the opening 52 and cavity 54 providing the structure shown in FIG. 5G. Dielectric material 114 and 114' includes, but is not limited to air, a low-temperature oxide, a spun-on glass, or a low k (k of less than 4.0) dielectric material that can be porous or non-porous and any combination thereof. A conventional process such as CVD can be used in forming the dielectric material 114 and 114'; and an optional planarization process can be used to remove excess dielectric material 114' that extends above the surface of the at least one trench isolation region. After these steps, the inventive trench isolation region 120 is formed which includes trench dielectric material 124 and the dielectric material 114' having the lower stress value than trench dielectric material 124.

At this point of the inventive process, a conventional CMOS process can be used to provide the structure shown in FIGS. 1-3. That is a conventional CMOS process is used to form at least one CMOS device, i.e., FET, in each of the active areas, i.e., atop the first semiconductor surface layer and the second semiconductor surface layer) of the structure shown in FIG. 5G. In FIG. 1, reference numeral 108 is used to denote a first semiconductor device, i.e., first FET, formed on the first semiconductor surface layer 104, while reference numeral 116 is used to denote a second semiconductor device formed on the second semiconductor surface layer 112. The FET formed in each of the active areas is dependent on the type of crystallographic orientation that is present in the semiconductor surface layer. For example, pFETs are formed into the crystallographic surface that is (110) oriented, while nFETs are formed into the crystallographic surface that is (100) oriented. These orientations represent the optimal orientations for pFETs and nFETs, respectively.

The FET is formed utilizing any conventional CMOS process that is capable of forming a FET. One method includes the steps of forming a layered stack comprising a gate dielectric 60 (See FIG. 2) and a gate conductor 70 (See FIG. 2) on each of the first and second semiconductor surface layers. The gate dielectric can be formed by a thermal process such as oxidation or by a conventional deposition process such as chemical vapor deposition (CVD), plasma enhanced QVD, evaporation, atomic layer deposition (ALD) and other like deposition processes. The gate dielectric present in each of the FETs can comprise the same or different insulating material including, for example, an oxide, nitride, oxynitride, high k dielectric such as $HfO_2$, $ZrO_2$, $TiO_2$, $Al_2O_3$, and a perovskite type oxide, or any combination thereof including multilayers.

The gate conductor is formed by a deposition process such as CVD, PECVD, sputtering, plating, evaporation, atomic layer deposition and the like. The gate conductor in each of the active areas can be comprised of the same or different conductive material, including, for example, poly Si, poly SiGe, a metal, a metal alloy, a metal silicide, a metal nitride or combinations including multilayers thereof. When multilayers are present, a diffusion barrier (not shown), such as TiN or TaN, can be positioned between each of the conductive layers. A capping layer (also not shown), such as an oxide, or nitride, can be located atop the gate conductors of each of the FETs. When polySi or SiGe gates are used, the conductive material can be doped in-situ or following deposition by ion implantation. Implantation masks and ion implantations are used to form the FETs of different conductivities.

Following the formation of the layered stack, at least the gate conductor (and optionally the gate dielectric) is patterned by lithography and etching. A passivation layer is formed to protect the gate stack. Thereafter, S/D extensions (not specifically labeled) are formed by ion implantation and annealing (RTA and/or laser) following an offset oxide or nitride spacer formation which is optional. At least one sidewall spacer 80 is then formed by deposition and etching and thereafter S/D regions are formed by ion implantation and annealing. The annealing step used for activating the S/D extension can be omitted and activation can occur during the activation of the S/D regions. The at least one spacer 80 that is present is typically comprised of an oxide, nitride or oxynitride including combinations and multilayers thereof. In embodiments in which a passivation layer is present, that layer is typically comprised of an oxide, nitride or oxynitride.

Each FET also includes S/D extensions and S/D regions, together with the gate conductor. The S/D extensions and S/D regions are comprised of the first and second semiconductor surface layers that have been doped with either n- or p-type dopants by ion implantation and/or by in-situ doping during epitaxial growth. The S/D extensions are typically shallower in depth than the S/D regions.

Stressed liners 90A and 90B are shown on top of portions of the first and second semiconductor surface layers as well as at least one, preferably, both, of the FETs. The presence of the stress liners introduces stress into the first and second semiconductor surface layers (to express the presence of stress layers, 104 and 112 are labeled as 104' and 112'). The stressed liners 90A and 90B may comprise a single layer or multiple layers. The stressed liners 90A and 90B are comprised of any stress inducing material such as a nitride or a high density plasma (HDP) oxide, or a combination thereof. The stressed liners can formed by various chemical vapor deposition (CVD) processes such as low pressure CVD (LPCVD), plasma enhanced CVD (PECVD), rapid thermal CVD (RTCVD) or BTBAS-based ($C_8H_{22}N_2Si$ reacted with ammonia) CVD, where BTBAS is a modern metalorganic precursor for CVD application. The later process provides a low temperature nitride film having high stress. The stress inducing materials can be under tensile stress (typically when the FET is an nFET) or compressive stress (typically when the stressed liner is on a pFET).

Preferably, the tensile strain inducing liner comprises a nitride, such as $Si_3N_4$, wherein the process conditions of the deposition process are selected to provide an intrinsic tensile strain within the deposited layer. For example, plasma enhanced chemical vapor deposition (PECVD) can provide nitride stress inducing liners having an intrinsic tensile strain. The stress state (tensile or compressive) of the nitride stress inducing liners deposited by PECVD can be controlled by changing the deposition conditions to alter the reaction rate within the deposition chamber. More specifically, the stress state of the deposited nitride strain inducing liner may be set by changing the deposition conditions such as: $SiH_4/N_2/He$ gas flow rate, pressure, RF power, and electrode gap.

In another example, rapid thermal chemical vapor deposition (RTCVD) can provide nitride tensile strain inducing liners having an internal tensile strain. The magnitude of the internal tensile strain produced within the nitride tensile strain inducing liner deposited by RTCVD can be controlled by changing the deposition conditions. More specifically, the magnitude of the tensile strain within the nitride strain inducing liner may be set by changing deposition conditions such as: precursor composition, precursor flow rate and temperature.

In some embodiments of the present invention, not shown, embedded wells are present in both the first and second semiconductor surface layers. The embedded wells are located within the source/drain regions are they are typically comprised of a semiconductor material that includes pure Si or Si containing C and/or Ge. Illustratively, the embedded wells can comprised SiC or SiGe. Typically, a C-containing well is used for nFETs, while a Ge-containing well is used for pFETs. These epitaxially grown embedded wells may be intrinsic or they may be doped with, for example, B, As, or P.

In cases in which a stressed liner is present, the stressed liner is formed by deposition and etching, after the at least one CMOS device has been formed. Examples of deposition processes that can be used include, CVD, PECVD or RTCVD. The etching step includes providing a patterned resist over portions of the stressed inducing layer and then etching the exposed portions of the stressed liner. In the case that dual liners are used (tensile for nFET and compressive for PFET), the first liner is formed on first type of FETs (e.g., nFETs) and removed completely on the second type of FETs (e.g., pFETs) before the second liner is formed on the second type of FETs (pFETs). Then the second liner is removed from the first type of FETs (nFETs).

In cases in which the embedded wells are formed, the CMOS device is first provided in each of the active areas of different crystallographic orientation. Next, exposed portions of the hybrid oriented substrate are recessed by an etching process (RIE and/or wet etch), preferably to provide a slight undercut beneath each of the spacers. That is, a selective anisotropic or isotropic etching process can be used to remove portions of the hybrid oriented substrate. The isotropic etch provides the slight undercut beneath the spacers. The recessing in areas of different crystal orientations, i.e., (100) vs. (110) orientations, will have different etch rates. Following the recessing process in which an etch is used, the etched surfaces are cleaned utilizing any cleaning process that can remove contaminates including residual oxides from the recessed surfaces. A selective epitaxial growth process (RTCVD or UHVCVD) can than be used to form the embedded wells. In embodiments in which RTCVD (rapid thermal CVD) is used, the following conditions are typically used: deposition temperature of about 500° C. to about 1000° C., pressure from about 5 to about 100 Torr, and a precursor comprising a Si source such as a silane, a disilane, or a dichlorosilane, a Ge source such as $GeH_4$ or a C source such as an alkene. Alternatively, it is possible that the embedded wells can be formed by gas phase doping into the S/D regions.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A method of forming a semiconductor structure comprising:
    providing a hybrid orientated semiconductor substrate comprising a first active area having a first semiconductor surface layer of a first crystallographic orientation located on a surface of a buried insulating material and a second active area having a second semiconductor surface layer of a second crystallographic orientation located within said hybrid orientated semiconductor substrate, wherein said first and second crystallographic orientations are different;
    forming a trench isolation region located between said first and second active areas, said trench isolation region is filled with a trench dielectric material;
    forming a lithographically defined opening within said trench isolation region in a region that laterally abuts said second semiconductor surface layer to expose sidewalls of said second semiconductor surface layer;
    laterally etching at least an upper portion of a buffer layer that is present directly beneath said second semiconductor surface layer forming a cavity which extends below said second semiconductor surface layer; and
    filling said cavity and the lithographically defined opening within said trench isolation region with a dielectric material that has a lower stress value than said trench dielectric material.

2. The method of claim 1 wherein said trench dielectric material and said dielectric material within said trench introduce stress into the abutting first and second semiconductor surface layers.

3. The method of claim 2 further comprising forming at least one first FET within said first active area and forming at least one second FET within said second active area, wherein said at least one first FET and said at least one second FET have different conductivities.

4. The method of claim 3 farther comprising forming a first stress-inducing liner within said first active area and forming a second stress-inducing liner within said second active area, said first and second stress-inducing liner are of a different stress type.

* * * * *